Figure 1:
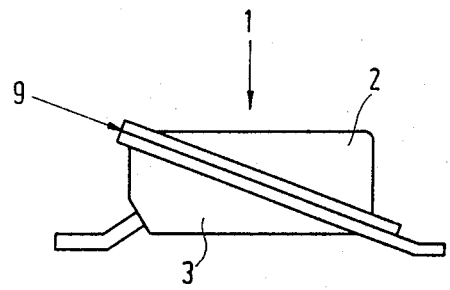

United States Patent [19]

Fick

[11] Patent Number: 4,891,469

[45] Date of Patent: Jan. 2, 1990

[54] PIEZOELECTRIC RESONATOR HOUSING FOR SURFACE MOUNTING

[75] Inventor: Franz L. Fick, Hamburg, Fed. Rep. of Germany

[73] Assignee: U.S. Philips Corporation, New York, N.Y.

[21] Appl. No.: 244,443

[22] Filed: Sep. 14, 1988

[30] Foreign Application Priority Data

Sep. 22, 1987 [DE] Fed. Rep. of Germany ....... 3731785

[51] Int. Cl.[4] ............................................... H05K 5/06
[52] U.S. Cl. .................................. 174/52.3; 174/50.53
[58] Field of Search ................. 174/18, 50, 50.5, 52.3, 174/17.05, 17.08, 50.52, 50.53, 50.56, 52.4; 310/344, 348, 351, 353; 220/4 E; 361/404, 405; 357/74

[56] References Cited

U.S. PATENT DOCUMENTS

| 3,754,153 | 8/1973 | Carpenter et al. | 310/344 |
| 4,190,735 | 2/1980 | Checki, Jr. | 174/52.3 X |
| 4,639,632 | 1/1987 | Nakata et al. | 310/353 |

FOREIGN PATENT DOCUMENTS

| 758826 | 3/1953 | Fed. Rep. of Germany | 174/50 |
| 155435 | 7/1956 | Sweden | 174/52.3 |

Primary Examiner—Laramie E. Askin

[57] ABSTRACT

A box-like or sleeve-like piezoelectric resonator housing which can be sealed hermetically having connection conductors suitable for surface mounting, consisting of two housing parts which can be connected together, connection conductors being led through a housing part in an insulated manner and at least one further connection conductor being connected to the housing part. The housing is divided into two parts along a diagonal plane to render components mounted in the lower part accessible after the lower part is mounted on a surface and before the upper part is joined to the lower part.

5 Claims, 1 Drawing Sheet

U.S. Patent     Jan. 2, 1990     4,891,469

PIEZOELECTRIC RESONATOR HOUSING FOR SURFACE MOUNTING

The invention relates to a box-like or sleeve-like piezoelectric resonator housing which can be sealed hermetically having connection conductors suitable for surface mounting, consisting of two housing parts which can be connected together, connection conductors being led through a part of the housing in an insulated manner and at least one further connection conductor being connected to the part of the housing.

A housing of this type is known from Datenbuch 1986 of Company Telequarz, page 8.

In the known housings the welding seam connecting the two housing parts extends perpendicularly to the mounting surface (printed circuit board), which impedes mounting and makes a larger distance between housing and printed circuit board necessary.

It is the object of the invention to mitigate this disadvantage and to construct the housing so that manipulations can still be carried out at the piezoelectric resonator already connected to the connection conductors when the part of the housing carrying the connection conductors is already mounted and contacted.

According to the invention this object is achieved in that the housing is severed, in a plane which is inclined with respect to its base plane into an upper and a lower housing part which can be connected together, that the connection conductors of the component insulated at one end are led through the part of the housing to which on the oppositely located side at least one further connection conductor is connected, and that the piezoelectric resonator is mounted in the lower part of the housing.

Further embodiments of the invention will become apparent from the claims.

A piezoelectric resonator housing according to the invention distinguishes in that its assembly on the printed circuit board is not influenced by the connection of the housing parts and that the housing is constructed so that, should this be necessary, it need be closed only when the lower part of the housing with the piezoelectric resonator has already been mounted on the printed circuit so as to be fully operational.

Figure 2:
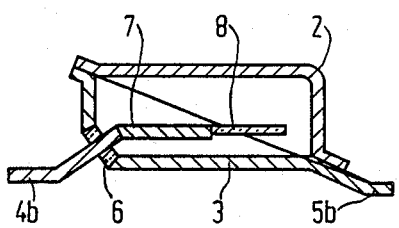
Figure 3:
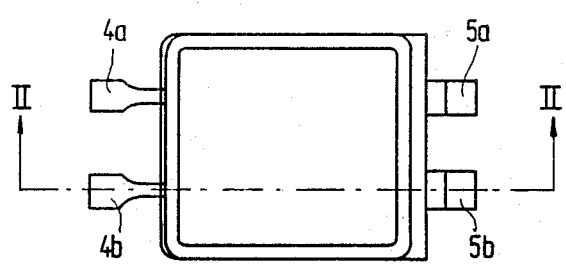

An embodiment of the invention will now be described in greater detail hereinafter with reference to the accompanying drawings, in which FIG. 1 is a side elevation view of a piezoelectric resonator housing according to the invention, FIG. 2 is a perpendicular sectional view through the housing shown in FIG. 1 in the direction of arrows II—II of FIG. 3, FIG. 3 is a plan view of the housing shown in FIG. 1.

The box-shaped housing 1 shown in FIG. 1 is severed into two parts 2 and 3 along a plane 9 which is inclined with respect to the base plane. Parts 2 and 3 in this plane 9 form flanges which are connected together in the final position by welding or in any other manner. The plane preferably extends diagonally in the housing, i.e. from its left hand upper side to its right-hand lower side.

The piezoelectric resonator 8 (FIG. 2) is mounted in the lower part of the housing 3. In this part of the housing two connection conductors 4a and 4b (FIG. 3) which are insulated from the housing by a glass lead-through, such as 6, (FIG. 2) and which are suitable for surface mounting extend from one side. On the oppositely located lower side of the lower housing part 3, part 3 itself forms two integral connection conductors 5a and 5b (FIG. 3) so that the housing can readily be mounted on a printed circuit board by means of the usual (automatic) methods. Optionally only one integral connection conductor could be formed with part 3.

The piezoelectric resonator 8 is connected to the connection conductors 4a and 4b by an auxiliary member 7 and extends in the direction of the lower edge of the lower housing part 3 so that even with fully contacted housing the piezoelectric resonator can be manipulated—so long as the upper housing part 2 has not been provided.

The upper housing part 2 is connected to the lower housing part 3 in a suitable manner, for example, by welding or bonding. In certain circumstances this can be done only when the lower housing part 3 with the component 8 has already been connected by its connection conductors 4 and 5 on a printed circuit board, for example, by soldering or by means of a conductive adhesive.

The two housing parts 2 and 3 are preferably deep drawn from sheet-metal. Together they preferably form a box-like or square housing; however, the housing may also be constructed in the form of a sleeve, i.e. form a circular cross-section in the plan view.

Besides for piezoelectric resonators, the housing according to the invention is of course also suitable for other components which are to be accommodated in a hermetically sealed housing having connection conductors suitable for surface mounting.

What is claimed is:

1. A hermetically sealable electrical component housing having electrical connection conductors outside said housing which render it suitable for surface mounting, said housing having a planar base and being divided along a plane which is inclined with respect to the plane of the base into upper and lower housing parts adaptable for connection to each other, at least one electrical connection conductor being led through the lower housing part and being insulated therefrom, at least one further electrical connection conductor being connected to said lower housing part, said at least one further electrical connection conductor being located on the opposite side of said lower housing part from said at least one electrical connection conductor, whereby said lower housing part can be mounted on a surface without said upper housing part being connected to it, which renders an electrical component connected to at least one of said electrical connection conductors accessible while said lower housing part is so mounted on said surface, said electrical connection conductors comprising legs for mounting said lower housing part on said surface.

2. A housing as claimed in claim 1, wherein the inclined plane intersects the housing diagonally.

3. A housing as claimed in claim 2, wherein the edges of the upper and lower housing parts are weldable together.

4. A housing as claimed in claim 1, wherein the edges of the upper and lower housing parts which can be connected together are formed as flanges.

5. A housing as claimed in claim 1, wherein said at least one further electrical connection conductor connected to the lower housing part is formed integrally with the lower housing part.

* * * * *